(12) United States Patent
Lim et al.

(10) Patent No.: US 11,393,936 B2
(45) Date of Patent: Jul. 19, 2022

(54) COLORED TRANSPARENT SOLAR CELL

(71) Applicant: ELECTRONICS AND TELECOMMUNICATIONS RESEARCH INSTITUTE, Daejeon (KR)

(72) Inventors: JungWook Lim, Daejeon (KR); Ga Young Kim, Daejeon (KR); Sun Jin Yun, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 35 days.

(21) Appl. No.: 16/727,590

(22) Filed: Dec. 26, 2019

(65) Prior Publication Data
US 2020/0411705 A1   Dec. 31, 2020

(30) Foreign Application Priority Data

Jun. 26, 2019 (KR) .................. 10-2019-0076580
Nov. 12, 2019 (KR) .................. 10-2019-0144479

(51) Int. Cl.
*H01L 31/0216* (2014.01)
*H01L 31/0224* (2006.01)
*H01L 31/18* (2006.01)

(52) U.S. Cl.
CPC ........ *H01L 31/022483* (2013.01); *H01L 31/02168* (2013.01); *H01L 31/022425* (2013.01); *H01L 31/1884* (2013.01)

(58) Field of Classification Search
CPC ..... H01L 31/022425; H01L 31/022483; H01L 31/0232; H01L 31/02327; H01L 31/054; H01L 31/02167; H01L 31/02168
See application file for complete search history.

(56) References Cited

U.S. PATENT DOCUMENTS

| 4,940,495 A * | 7/1990 | Weber .............. H01L 31/02168 136/256 |
| 2010/0237374 A1 | 9/2010 | Chu et al. |
| 2010/0300514 A1* | 12/2010 | Denda ............. H01L 31/022425 136/252 |
| 2012/0186625 A1 | 7/2012 | Jee |

(Continued)

FOREIGN PATENT DOCUMENTS

| KR | 101567265 B1 | 11/2015 |
| KR | 101602922 B1 | 3/2016 |
| KR | 101858570 B1 | 5/2018 |

OTHER PUBLICATIONS

Jung Wook Lim et al., "Colored a-Si:H transparent solar cells employing ultrathin transparent multi-layered electrodes", Solar Energy Materials & Solar Cells, vol. 163, pp. 164-169, Apr. 2017.

*Primary Examiner* — Christina Chern
(74) *Attorney, Agent, or Firm* — Rabin & Berdo, P.C.

(57) ABSTRACT

Provided is a transparent solar cell including a first transparent electrode, a second transparent electrode, a light absorbing layer, a first color implementation layer, and a second implementation layer, wherein each of the first color implementation layer and the second implementation layer includes an insulation layer and a conductive layer. By using a double layer, it is possible to provide a colored transparent solar cell securing stability and durability and implementing colors on both sides.

9 Claims, 7 Drawing Sheets

(56) References Cited

U.S. PATENT DOCUMENTS

2015/0053262 A1    2/2015   Lim et al.
2016/0190367 A1    6/2016   Kim et al.
2018/0212090 A1    7/2018   Do et al.

* cited by examiner

COLORED TRANSPARENT SOLAR CELL

CROSS-REFERENCE TO RELATED APPLICATIONS

This U.S. non-provisional patent application claims priority under 35 U.S.C. § 119 of Korean Patent Application Nos. 10-2019-0076580, filed on Jun. 26, 2019, and 10-2019-0144479, filed on Nov. 12, 2019, the entire contents of which are hereby incorporated by reference.

BACKGROUND

The present disclosure relates to a colored transparent solar cell, and more particularly, to a colored transparent window-type solar cell capable of color realization on both sides using a double layer.

Currently, solar cells are mainly crystalline silicon-based solar cells, and the BIPV technology for a solar cell which is integrated into a building in a city and generates electricity is being actively researched on and developed. It is very important for the BIPV to secure a sufficiently high amount of power generation without compromising an urban landscape. In addition, future transparent solar windows are also currently being actively researched on. In the case of a solar window, along with a certain high amount of electricity generation, the transmission thereof must be sufficiently secured, and in order to satisfy an aesthetic effect, it should be possible to implement various colors. Currently, as solar cells suitable for solar windows, organic solar cells, dye-sensitized solar cells, and perovskite solar cells are mainly researched on, and such cells are required to have excellent durability and visibility.

SUMMARY

The present disclosure provides a colored transparent window-type solar cell capable of color realization on both sides using a double layer.

The present disclosure also provides a method for manufacturing a colored transparent window-type solar cell capable of color realization on both sides using a double layer.

The problems to be solved by the inventive concept are not limited to the above-mentioned problems, and other problems that are not mentioned may be apparent to those skilled in the art from the following description.

An embodiment of the inventive concept provides a colored transparent solar cell including a first transparent electrode, a second transparent electrode on the first transparent electrode, a light absorbing layer disposed between the first transparent electrode and the second transparent electrode, a first color implementation layer disposed adjacent to the first transparent electrode, and a second color implementation layer disposed adjacent to the second transparent electrode, wherein the first color implementation layer includes a first insulation layer on the first transparent electrode, and a first conductive layer between the first transparent electrode and the first insulation layer.

In an embodiment, the second color implementation layer includes a second insulation layer on the second transparent electrode, and a second conductive layer between the second transparent electrode and the second insulation layer.

In an embodiment, a lower substrate may be further included wherein the lower substrate may be a transparent substrate.

In an embodiment, the transparent substrate may include any one among glass, sapphire, PI, PET, and PEN.

In an embodiment, the light absorbing layer may include any one among amorphous silicon, microcrystalline silicon, silicon oxide, silicon nitride, silicon carbide and silicon-germanium.

In an embodiment, the first insulation layer may include any one among $SiO_2$, SiN, $Al_2O_3$, $ZrO_2$, ZnO, $TiO_2$, SiTiO, AlTiO, AlSiO, and SiZrO.

In an embodiment, the first conductive layer may include an oxide conductor or a metal.

In an embodiment, the oxide conductor may include ZnO or $SnO_2$, and the metal may include Ag, Al, Cu, or Au.

In an embodiment, the thickness or refractive index of each of the first insulation layer and the first conductive layer may be adjusted to implement the color of the first color implementation layer, the thickness or refractive index of each of the second insulation layer and the second conductive layer may be adjusted to implement the color of the second color implementation layer, and the color of the first color implementation layer and the color of the second color implementation layer may be independently implemented.

In an embodiment, a first hole penetrating the first transparent electrode and the first conductive layer and exposing the first insulation layer may be further included, wherein the light absorbing layer may be extended into the first hole.

In an embodiment, a second hole penetrating the light absorbing layer and exposing the first transparent electrode may be further included, wherein the second transparent electrode may be extended into the second hole.

In an embodiment, a third hole penetrating from the second conductive layer through the light absorbing layer and exposing the first transparent electrode may be further included.

In an embodiment, a fourth hole penetrating from the second insulation layer through the light absorbing layer and exposing the first transparent electrode may be further included.

In an embodiment of the inventive concept, a method for manufacturing a colored transparent solar cell includes sequentially forming a first insulation layer and a first conductive layer of a first color implementation layer, forming a first transparent electrode on the first color implementation layer, forming a light absorbing layer on the first transparent electrode, forming a second transparent electrode on the light absorbing layer, and sequentially forming a second conductive layer and a second insulation layer of a second color implementation layer on the second transparent electrode, wherein forming each of the first and second insulation layers includes performing a first sub-cycle, and the first sub-cycle includes providing a first precursor, providing an inert gas, providing a reaction gas which reacts with the first precursor and providing the inert gas.

In an embodiment, after forming the first transparent electrode, forming a first hole penetrating the first transparent electrode and the first conductive layer to expose the first insulation layer, forming the light absorbing layer and then forming a second hole penetrating the light absorbing layer to expose the first transparent electrode, forming the second conductive layer and then forming a third hole penetrating from the second conductive layer to the light absorbing layer to expose the first transparent electrode, and forming the second insulation layer and then forming a fourth hole penetrating from the second insulation layer to the light absorbing layer to expose the first transparent electrode may be further included.

In an embodiment, the forming of each of the first and second insulation layers may further include performing a second sub-cycle after performing the first sub-cycle, wherein the second sub-cycle includes providing a second precursor, providing an inert gas, providing a reaction gas which reacts with the second precursor, and providing the inert gas.

In an embodiment, the thickness or refractive index of the first insulation layer and the first conductive layer may be adjusted to implement the color of the first color implementation layer, the thickness or refractive index of the second insulation layer and the second conductive layer may be adjusted to implement the color of the second color implementation layer, and the color of the first color implementation layer and the color of the second color implementation layer may be independently implemented.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
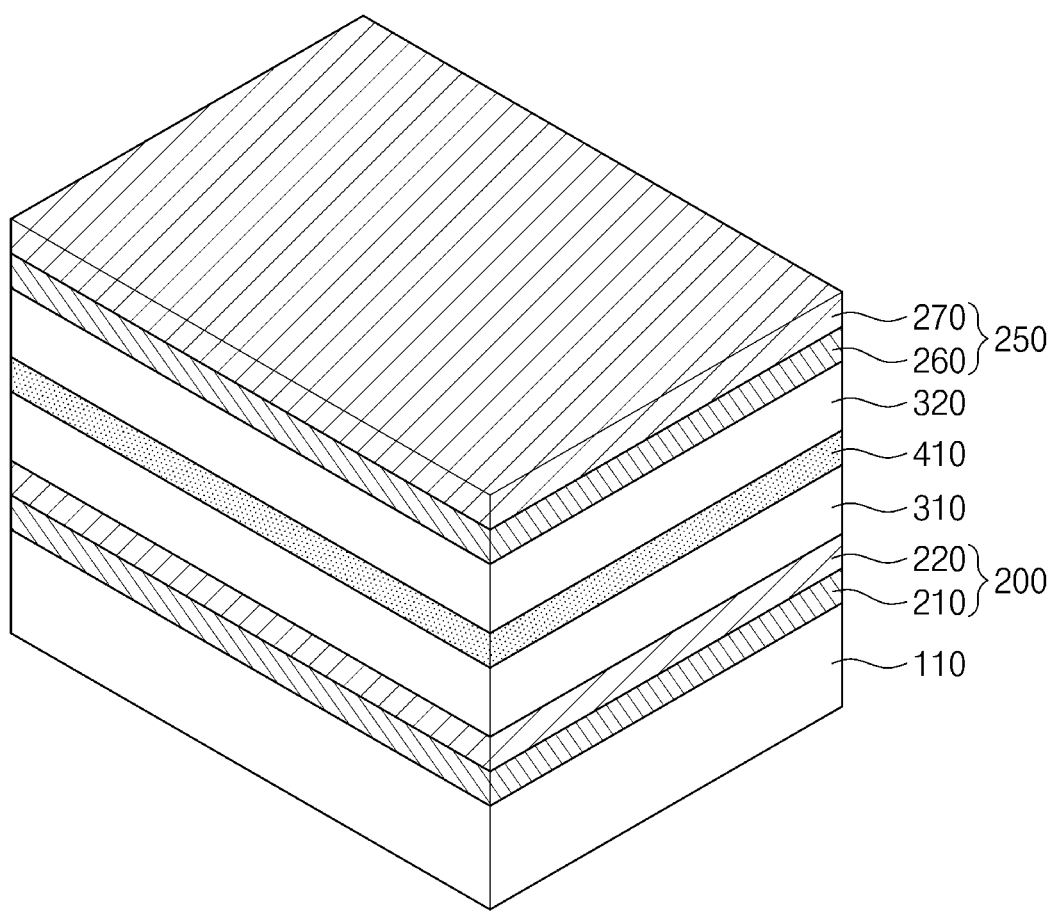
FIG. 1 is a perspective view showing a transparent solar cell according to an embodiment of the inventive concept.

Advantages and features of the inventive concept and methods of accomplishing the same may be understood more readily by reference to the following detailed description of exemplary embodiments and the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art to which the inventive concept pertains. The inventive concept will only be defined by the appended claims. The same reference numerals refer to like elements throughout the specification.

The terms used herein are for the purpose of describing embodiments and are not intended to be limiting of the inventive concept. In the present specification, singular forms include plural forms unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices.

In addition, embodiments described in the present specification will be described with reference to cross-sectional views and/or plan views which are ideal illustrations of the inventive concept. In the drawings, the thickness of films and regions are exaggerated for an effective description of technical contents. Accordingly, the shape of an example may be modified by manufacturing techniques and/or tolerances. Thus, the embodiments of the inventive concept are not limited to specific forms shown, but are intended to include changes in the form generated by a manufacturing process. Thus, the regions illustrated in the drawings have properties, and the shapes of the regions illustrated in the drawings are intended to exemplify specific shapes of regions of a device and are not intended to limit the scope of the inventive concept. Thus, the regions illustrated in the drawings have properties, and the shapes of the regions illustrated in the drawings are intended to exemplify specific shapes of regions of a device and are not intended to limit the scope of the inventive concept.

Unless otherwise defined, terms used in the embodiments of the inventive concept may be interpreted as meanings commonly known to those skilled in the art.

FIG. 1 is a perspective view showing a transparent solar cell according to an embodiment of the inventive concept.

Figure 2:
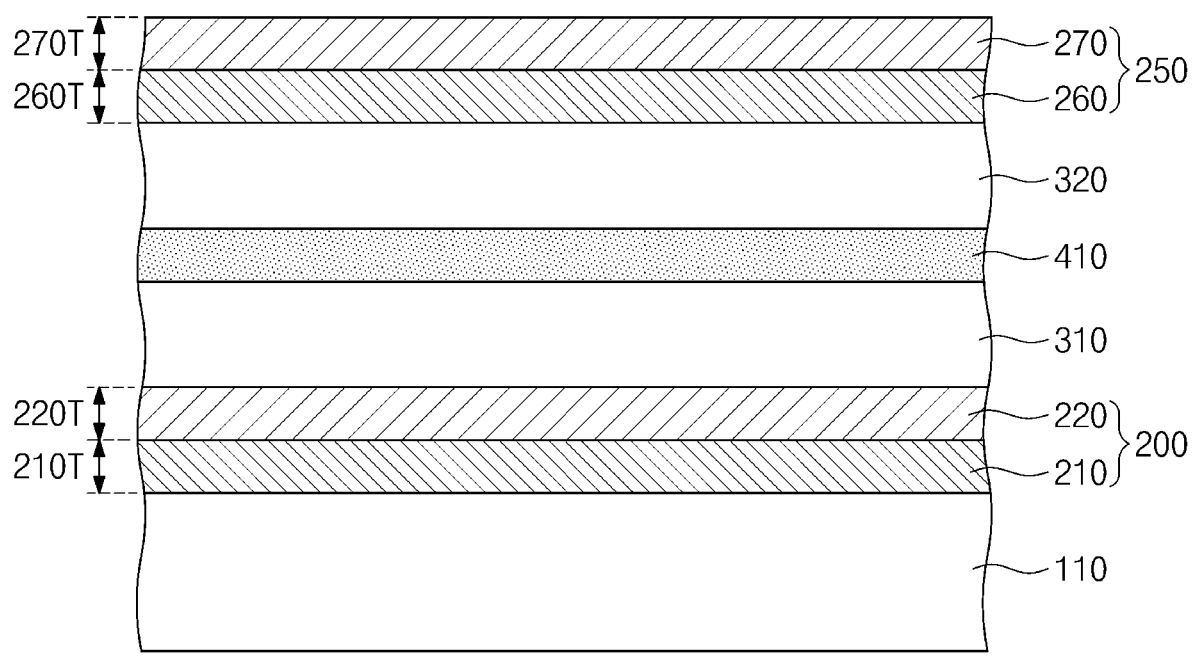
FIG. 2 is a cross-sectional view showing a transparent solar cell according to an embodiment of the inventive concept.

FIG. 2 is a cross-sectional view showing a transparent solar cell according to an embodiment of the inventive concept.

Referring to FIG. 1 and FIG. 2, a colored transparent solar cell includes a lower substrate 110, a first transparent electrode 310 on the lower substrate 110, a second transparent electrode 320 on the first transparent electrode 310, a light absorbing layer 410 disposed between the first transparent electrode 310 and the second transparent electrode 320, a first color implementation layer 200 disposed between the lower substrate 110 and the first transparent electrode 310, and a second color implementation layer 250 disposed on the second transparent electrode 320, wherein each of the first color implementation layer 200 and the second color implementation layer 250 may be a double layer.

The first color implementation layer 200 may include a first conductive layer 220 adjacent to the first transparent electrode 310, and a first insulation layer 210 between the lower substrate 110 and the first conductive layer 220. The second color implementation layer 250 may include a second insulation layer 270 on the second transparent electrode 320, and a second conductive layer 260 between the second transparent electrode 320 and the second insulation layer 270.

The lower substrate 110 may be a transparent substrate, that is, a transparent glass substrate or a transparent plastic substrate. The transparent plastic substrate may be, for example, a glass, sapphire, polyimide (PI), polyethylene terephthalate (PET), polyethylenenaphthalate (PEN), polyether sulfone (PES), or acrylic material.

The first transparent electrode 310 may be a transparent conductive material. The first transparent electrode 310 may include, for example, any one or more among ITO, ZnO:Al, ZnO:Ga, SnO$_2$:F, FTO (F-doped SnO$_2$), ZnO, ATO (antimony Tin Oxide), WO$_x$, MoO$_x$, and ZnO/Ag/ZnO.

The second transparent electrode 320 may be a transparent conductive material. The second transparent electrode 320 may include the same or different material as the first transparent electrode 310. The second transparent electrode 320 may include, for example, any one or more among ITO, ZnO:Al, ZnO:Ga, SnO$_2$:F, FTO (F-doped SnO$_2$), ZnO, ATO (antimony Tin Oxide), WO$_x$, MoO$_x$, and ZnO/Ag/ZnO.

The light absorbing layer 410 may generate electricity from light energy through a photoelectric effect. For example, the light absorbing layer 410 may be any one among amorphous silicon, microcrystalline silicon, silicon oxide, silicon nitride, silicon carbide and silicon-germanium. Also, the light absorbing layer 410 may have the structure of a thin film, a single crystal, or a tandem crystal.

The first insulation layer 210 of the first color implementation layer 200 may be an electrically insulating material. For example, the first insulation layer 210 may include any one or more among SiO$_2$, SiN, Al$_2$O$_3$, ZrO$_2$, ZnO, TiO$_2$, SiTiO, AlTiO, AlSiO, and SiZrO. The second insulation layer 270 of the second color implementation layer 250 may include the same or different material as the first insulation layer 210 of the first color implementation layer 200. Specifically, the second insulation layer 270 of the second color implementation layer 250 may be an electrically insulating material. For example, the second insulation layer 270 may include any one or more among SiO$_2$, SiN, Al$_2$O$_3$, ZrO$_2$, ZnO, TiO$_2$, SiTiO, AlTiO, AlSiO, and SiZrO.

The first insulation layer 210 of the first color implementation layer 200 and the second insulation layer 270 of the second color implementation layer 250 may act as a protection film from moisture or external impurities.

The first conductive layer 220 of the first color implementation layer 200 may include an oxide conductor or a metal. For example, the oxide conductor may include ZnO or SnO$_2$, and the metal may include Ag, Al, Cu, or Au. The second conductive layer 260 of the second color implementation layer 250 may include the same or different material as the first conductive layer 220 of the first color implementation layer 200. Specifically, the second conductive layer 260 of the second color implementation layer 250 may include an oxide conductor or a metal. For example, the oxide conductor may include ZnO or SnO$_2$, and the metal may include Ag, Al, Cu, or Au.

The thickness 210T or refractive index of the first insulation layer 210 and the thickness 220T or refractive index of the first conductive layer 220 may each be adjusted to implement the color of the first color implementation layer 200, and the thickness 270T or refractive index of the second insulation layer 270 and the thickness 260T or refractive index of the second conductive layer 260 may each be adjusted to implement the color of the second color implementation layer 250. The color of the first color implementation layer 200 and the color of the second color implementation layer 250 may each be independently implemented.

The independent implementation of the color of the first color implementation layer 200 and the color of the second color implementation layer 250 may be changing only the color of the first color implementation layer 200 by adjusting the thickness or the refractive index of the first implementation layer 200 while maintaining the color of the second color implementation layer 250, or changing only the color of the second color implementation layer 250 by adjusting the thickness or the refractive index of the second implementation layer 250 while maintaining the color of the first color implementation layer 200.

The colored transparent solar cell according to an embodiment of the inventive concept may stably implement various colors by configuring each of the first and second color implementation layers 200 and 250 as a double layer of a conductive layer and an insulation layer. Furthermore, as the light transmittance and light absorbing properties of the transparent solar cell are secured, the transparent solar cell may be used as a transparent solar cell for windows.

Figure 3:
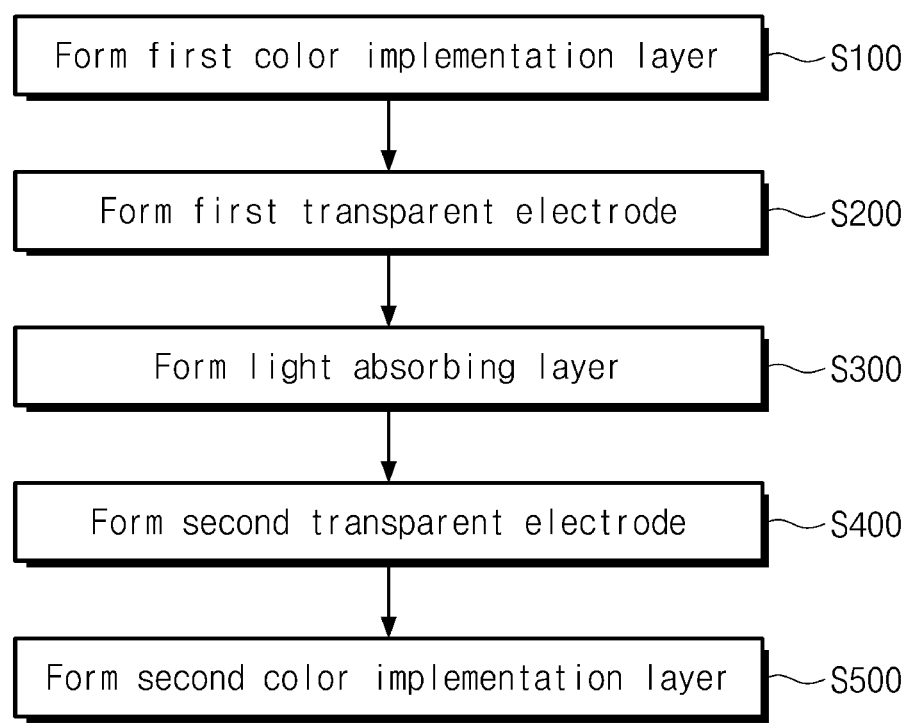
FIG. 3 is a flowchart showing a method for manufacturing the transparent solar cell of FIG. 1.
Figure 4:
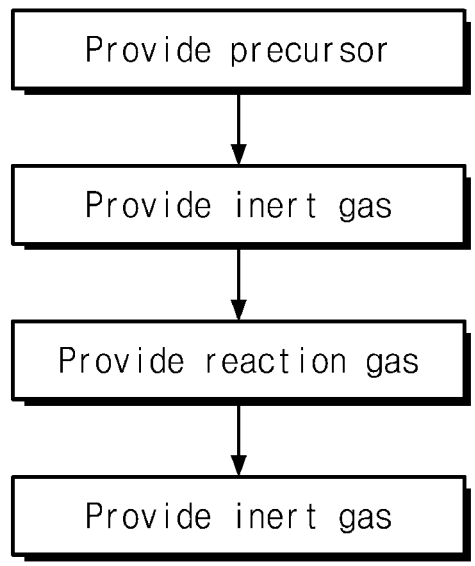
FIG. 4 is a flowchart showing a method for forming the first and second color implementation layers of FIG. 3.
Figure 5:
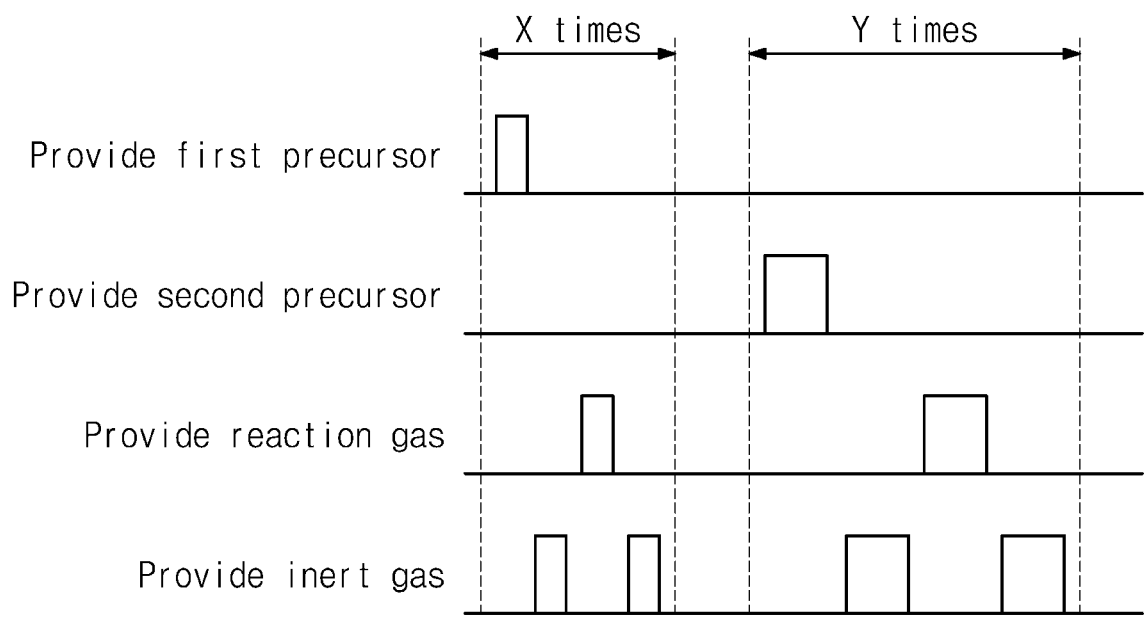
FIG. 5 is a conceptual diagram of a process for forming the first and second color implementation layers of FIG. 3.

FIG. 3 is a flowchart showing a method for manufacturing the transparent solar cell of FIG. 1. FIG. 4 is a flowchart showing a method for forming the first and second color implementation layers 200 and 250 of FIG. 3. FIG. 5 is a conceptual diagram of a process for forming the first and second color implementation layers 200 and 250 of FIG. 3.

Referring to FIG. 1 and FIG. 3, the first color implementation layer 200 may be formed on the lower substrate 110. The formation of the first color implementation layer 200 may include sequentially forming the first insulation layer 210 and the first conductive layer 220 on the lower substrate 110.

Specifically, referring to FIG. 4 and FIG. 5, the formation of the first insulation layer 210 includes performing a first sub-cycle, wherein the first sub-cycle may include providing a first precursor, providing an inert gas, providing a reaction gas which reacts with the first precursor, and providing the inert gas. For example, the reaction gas may be oxygen, sulfur, or nitrogen, and the first precursor may react with the reaction gas to generate an oxide, a sulfide, or a nitride.

The formation of the first insulation layer 210 may further include performing a second sub-cycle after performing the first sub-cycle, wherein the second sub-cycle may include providing a second precursor, providing an inert gas, providing a reaction gas which reacts with the second precursor, and providing the inert gas. For example, the reaction gas may be oxygen, sulfur, or nitrogen, and the second precursor may be different from the first precursor. The second precursor may react with the reaction gas to generate an oxide, a sulfide, or a nitride.

The first conductive layer 220 may be formed in substantially the same manner as the first insulation layer 210. However, a precursor and a reaction gas for forming the first conductive layer 220 may be different from a precursor and a reaction gas for forming the first insulation layer 210.

Referring to FIG. 1 and FIG. 3, the first transparent electrode 310 may be formed on the first color implementation layer 200. For example, the first transparent electrode 310 may be formed by a vacuum deposition method such as sputtering or evaporation.

The light absorbing layer 410 may be formed on the first transparent electrode 310. For example, the light absorbing layer 410 may be formed by a vacuum deposition method such as sputtering or evaporation.

The second transparent electrode 320 may be formed on the light absorbing layer 410. For example, the second transparent electrode 320 may be formed by a vacuum deposition method such as sputtering or evaporation.

The second color implementation layer 250 may be formed on the second transparent electrode 320. The formation of the second color implementation layer 250 may include sequentially forming the second conductive layer 260 and the second insulation layer 270 on the second transparent electrode 320. The second conductive layer 260 may be formed in substantially the same manner as the first conductive layer 220. The second insulation layer 270 may be formed in substantially the same manner as the first insulation layer 210.

In the step of forming the first insulation layer 210 and the second insulation layer 270, the composition of an insulation layer material in each of the first insulation layer 210 and the second insulation layer 270 may be controlled by adjusting the ratio of sub-cycles of an atomic layer deposition (ALD) method. As a result, the thickness or refractive index of the first and the second color implementation layers 200 and 250, and various colors may be implemented by causing changes in optical interference. Both the first color and the second color implementation layers may independently implement a color, and since optical interference is used, it is also possible to predict color coordinates, optically.

Figure 6:
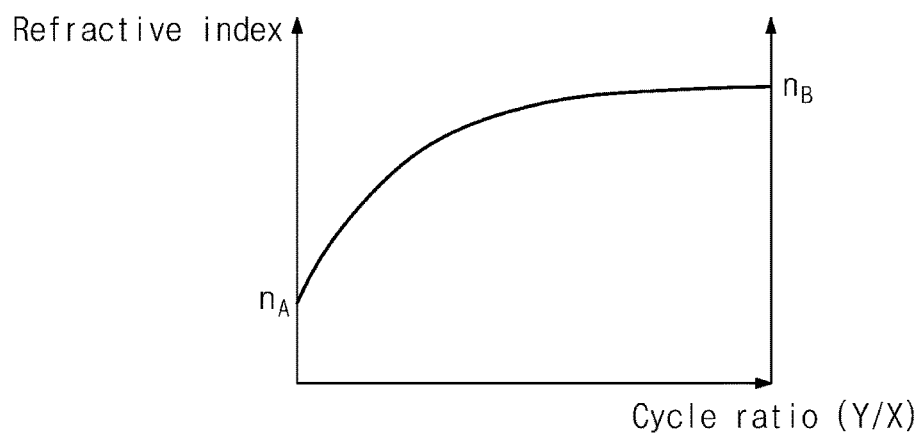
FIG. 6 is a graph showing that when the number of sub-cycles of a first insulation layer and a second insulation layer is adjusted to be controlled, a refractive index value between two materials are obtained.

FIG. 6 is a graph showing that when the number of sub-cycles of the first insulation layer 210 and the second insulation layer 270 is adjusted to be controlled, a refractive index value between two materials are obtained. In implementing a color, the product of the thickness and the refractive index is the optical thickness, so it is possible to implement a variety of colors by adjusting the refractive index as well as the thickness.

Figure 7:
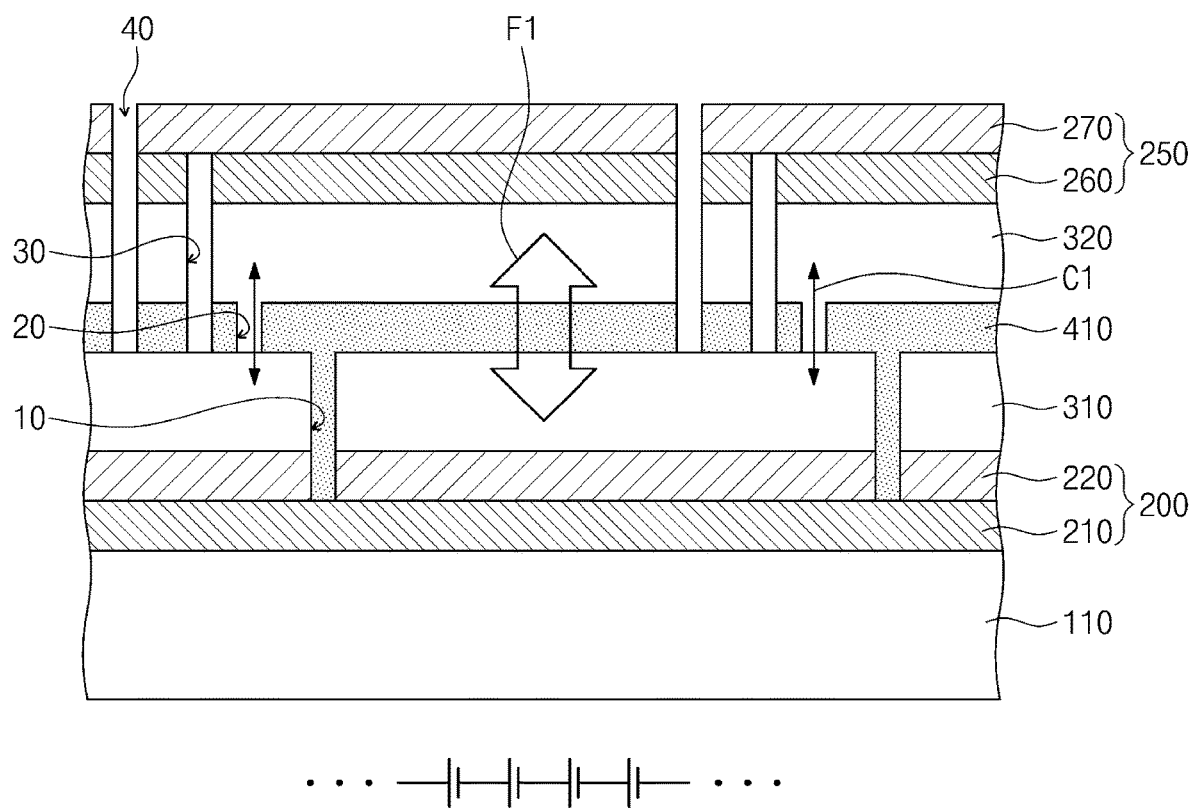
FIG. 7 is a cross-sectional view of a transparent solar cell manufactured by a method for manufacturing a transparent solar cell according to an embodiment of the inventive concept.

FIG. 7 is a cross-sectional view of a transparent solar cell manufactured by a method for manufacturing a transparent solar cell according to some embodiments of the inventive concept.

Referring to FIG. 7, the transparent solar cell includes a first hole 10 penetrating the first transparent electrode 310 and the first conductive layer 220 and exposing the first insulation layer 210, wherein the light absorbing layer 410 may be extended into the first hole 10.

The transparent solar cell includes a second hole 20 penetrating the light absorbing layer 410 and exposing the first transparent electrode 310, wherein the second transparent electrode 320 may be extended into the second hole 20.

The transparent solar cell may include a third hole 30 penetrating from the second conductive layer 260 through the light absorbing layer 410 and exposing the first transparent electrode 310.

The transparent solar cell may include a fourth hole 40 penetrating from the second insulation layer 270 through the light absorbing layer 410 and exposing the first transparent electrode 310.

In the colored transparent solar cell according to the inventive concept, cells are isolated by the above holes, and the isolated cells are connected in series, which is shown as an equivalent circuit in FIG. 7. In addition, FIG. 7 shows that there is an electrode connection C1 between the first transparent electrode 310 and the second transparent electrode 320, and schematically shows that there is electromotive force F1 generating between the first transparent electrode 310 and the second transparent electrode 320. According to some embodiments, a method for manufacturing the transparent solar cell of the inventive concept includes sequentially forming the first insulation layer 210 and the first conductive layer 220 of the first color implementation layer 200 (S100 of FIG. 3), forming the first transparent electrode 310 on the first color implementation layer 200 (S200 of FIG. 3), forming the light absorbing layer 410 on the first transparent electrode 310 (S300 of FIG. 3), forming the second transparent electrode 320 on the light absorbing layer 410 (S400 of FIG. 3), and sequentially forming the second conductive layer 260 and the second insulation layer 270 of the second color implementation layer 250 on the second transparent electrode 320 (S500 of FIG. 3), wherein forming each of the first and second insulation layers 210 and 270 may include performing the first sub-cycle.

As described above, the first sub-cycle may include providing a first precursor, providing an inert gas, providing a reaction gas which reacts with the first precursor, and providing the inert gas.

The formation of the first and second insulation layers 210 and 270 may further include performing a second sub-cycle after performing the first sub-cycle. At this time, the second sub-cycle may include providing a second precursor, providing an inert gas, providing a reaction gas which reacts with the second precursor, and providing the inert gas.

The method for manufacturing the transparent solar cell may further include forming the first transparent electrode 310 and then forming the first hole 10 penetrating the first transparent electrode 310 and the first conductive layer 220 to expose the first insulation layer 210, forming the light absorbing layer 410 and then forming the second hole 20 penetrating the light absorbing layer 410 to expose the first transparent electrode 310, forming the second conductive layer 260 and then forming the third hole 30 penetrating from the second conductive layer 260 to the light absorbing layer 410 to expose the first transparent electrode 310, and forming the second insulation layer 270 and then forming the fourth hole 40 penetrating from the second insulation layer 270 to the light absorbing layer 410 to expose the first transparent electrode 310.

According to some embodiments, a patterning process may be used to form holes in some layers of the transparent solar cell. For example, the above holes may be formed using laser scribing, which is mechanical scribing.

In the step of forming the light absorbing layer 410 on the first transparent electrode 310 on which the first hole 10 is formed, the light absorbing layer 410 may be filled in the first hole 10. In the step of forming of the second transparent electrode 320 on the light absorbing layer 410 on which the second hole 20 is formed, the second transparent electrode 320 may be filled in the hole 20.

The thickness 210T or refractive index of the first insulation layer 210 and the thickness 220T or refractive index of the first conductive layer 220 may each be adjusted to implement the color of the first color implementation layer 200, and the thickness 270T or refractive index of the second insulation layer 270 and the thickness 260T or refractive index of the second conductive layer 260 may each be adjusted to implement the color of the second color implementation layer 250. The color of the first color implementation layer 200 and the color of the second color implementation layer 250 may each be independently implemented.

The independent implementation of the color of the first color implementation layer 200 and the color of the second color implementation layer 250 may be changing only the color of the first color implementation layer 200 by adjusting the thickness or the refractive index of each of the first insulation layer 210 or the first conductive layer 220 while maintaining the color of the second color implementation layer 250, or changing only the color of the second color implementation layer 250 by adjusting the thickness or the refractive index of the second insulation layer 270 and the second conductive layer 260 while maintaining the color of the first color implementation layer 200.

Figure 8A:
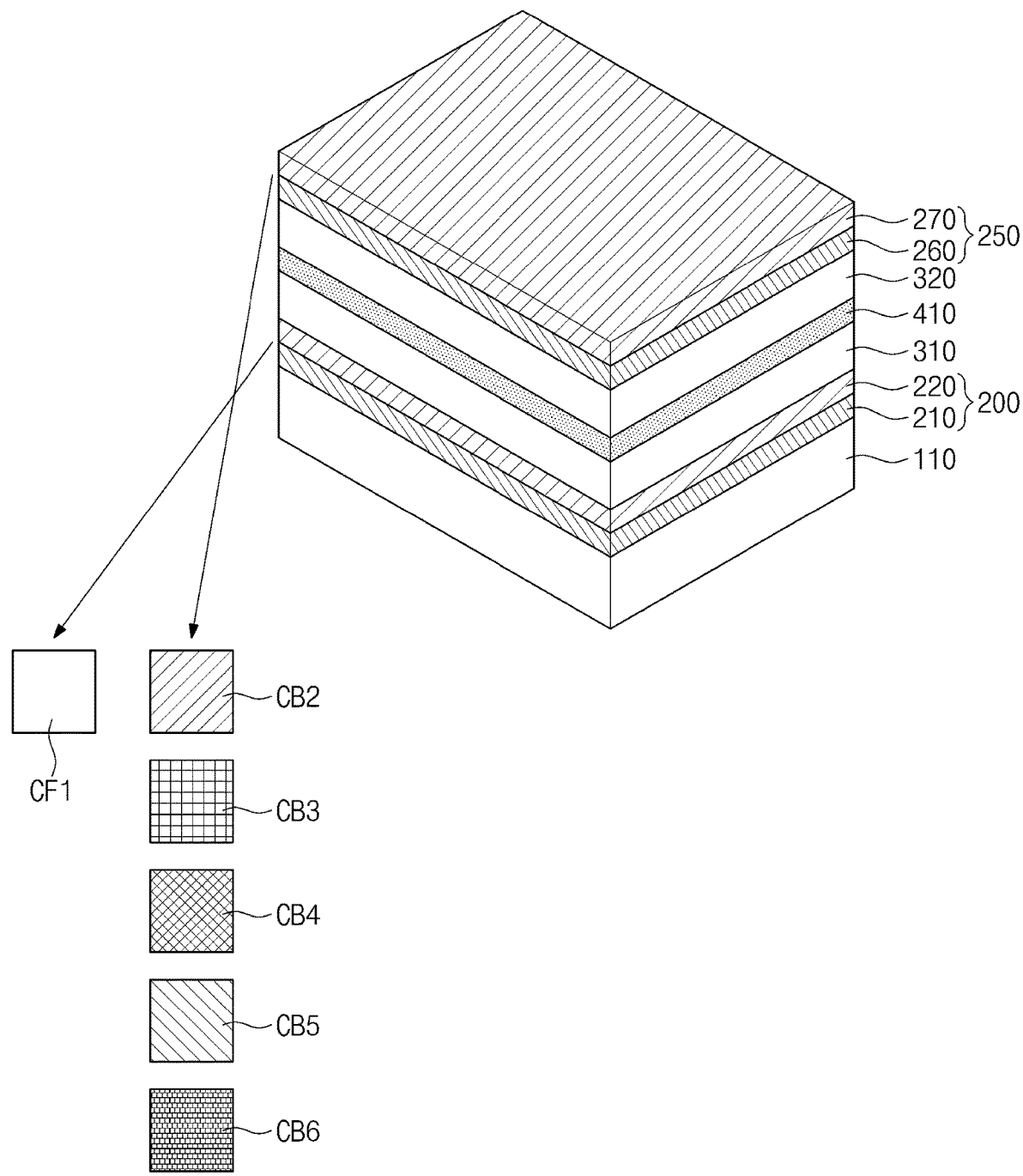
FIG. 8A is a schematic view showing how the thickness or refractive index of a second insulation layer and a second conductive layer is adjusted to implement only the color of a second color implementation layer.

FIG. 8A is a schematic view showing how the thickness or the refractive index of the second insulation layer 270 and the second conductive layer 260 is adjusted to implement only the color of the second color implementation layer 250. Specifically, by adjusting the thickness or the refractive index of each of the second insulation layer 270 and the second conductive layer 260 while maintaining a color CF1 of the first color implementation layer 200, it is possible to variously change the color of the second color implementation layer 250 to CB2 to CB6.

Figure 8B:
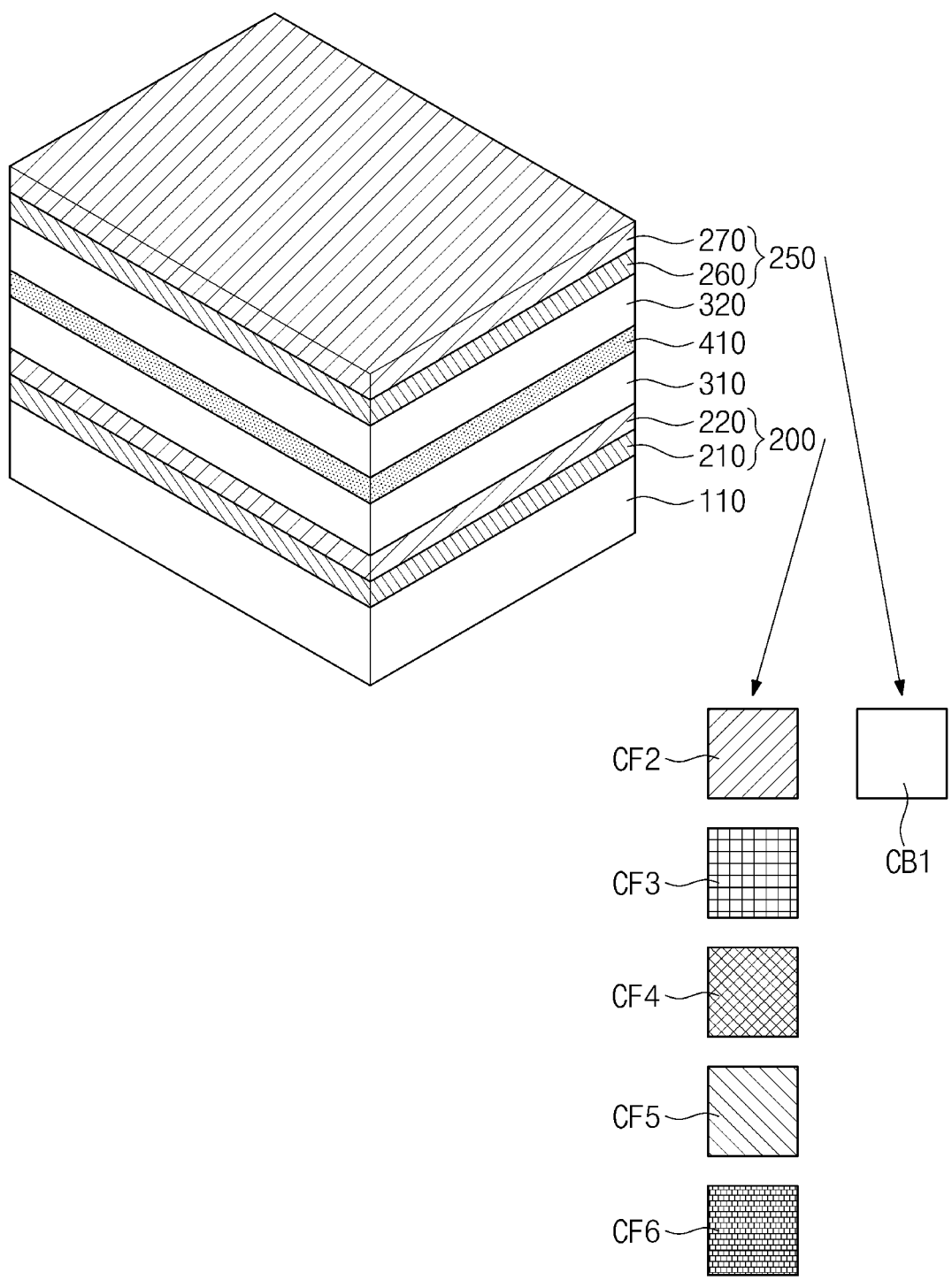
FIG. 8B is a schematic view showing how the thickness or refractive index of a first insulation layer and a first conductive layer is adjusted to implement only the color of a first color implementation layer.

FIG. 8B is a schematic view showing how the thickness or the refractive index of the first insulation layer 210 and the first conductive layer 220 is adjusted to implement only the color of the first color implementation layer 200. Specifically, by adjusting the thickness or the refractive index of each of the first insulation layer 210 and the first conductive layer 220 while maintaining a color CB1 of the second color implementation layer 250, it is possible to variously change the color of the first color implementation layer 200 to CF2 to CF6.

The solar cell of the inventive concept may independently implement the color of the first color implementation layer 200 and the color of the second color implementation layer 250 unlike a typical technology, and is characterized by maintaining the opposite color and controlling only the color of a desired color implementation layer.

A transparent solar cell according to the embodiments of the inventive concept is capable of implementing a variety of colors while securing both light transmittance and light absorbing properties, thereby securing aesthetics. In particular, stability and durability may be improved through the protection of moisture through the structure of the double layer.

Although the inventive concept has been described with reference to the accompanying drawings, it will be understood by those having ordinary skill in the art to which the present invention pertains that various changes in form and details may be made therein without departing from the spirit and scope of the inventive concept. Therefore, it is to be understood that the above-described embodiments described above are exemplary and non-limiting in every respect.

What is claimed is:

1. A colored transparent solar cell comprising:
    a first transparent electrode;
    a second transparent electrode on the first transparent electrode;
    a light absorbing layer disposed between the first transparent electrode and the second transparent electrode;
    a first color implementation layer disposed adjacent to the first transparent electrode;
    a second color implementation layer disposed adjacent to the second transparent electrode, the second color implementation layer including a first insulation layer on the second transparent electrode and a first conductive layer between the second transparent electrode and the first insulation layer;
    a first hole penetrating the first transparent electrode and at least some of the first color implementation layer, wherein the light absorbing layer is extended into the first hole;
    a second hole penetrating through the first conductive layer from a lower surface of the first insulation layer, through the light absorbing layer and exposing the first transparent electrode; and
    a third hole penetrating through the first insulation layer, the first conductive layer, the second transparent electrode and the light absorbing layer, and exposing the first transparent electrode;
    wherein the first color implementation layer includes:
        a second insulation layer on the first transparent electrode; and
        a second conductive layer between the first transparent electrode and the second insulation layer; and
    wherein the first hole penetrates the second conductive layer, and exposes the second insulation layer.

2. The colored transparent solar cell of claim 1, further comprising a lower substrate, wherein the lower substrate is a transparent substrate.

3. The colored transparent solar cell of claim 2, wherein the transparent substrate includes any one among glass, sapphire, polyimide (PI), polyethylene terephthalate (PET), and polyethylenenaphthalate (PEN).

4. The colored transparent solar cell of claim 1, wherein the light absorbing layer includes any one among amorphous silicon, microcrystalline silicon, silicon oxide, silicon nitride, silicon carbide and silicon-germanium.

5. The colored transparent solar cell of claim 1, wherein the second insulation layer includes any one among $SiO2$, SiN, $Al2O3$, $ZrO2$, ZnO, $TiO2$, SiTiO, AlTiO, AlSiO, and SiZrO.

6. The colored transparent solar cell of claim 1, wherein the second conductive layer includes an oxide conductor or a metal.

7. The colored transparent solar cell of claim 6, wherein the oxide conductor includes ZnO or $SnO_2$, and the metal includes Ag, Al, Cu, or Au.

8. The colored transparent solar cell of claim 1, wherein
    a color of the first color implementation layer corresponds to a thickness or refractive index of each of the second insulation layer and the second conductive layer,
    a color of the second color implementation layer corresponds to a thickness or refractive index of each of the first insulation layer and the first conductive layer, and
    the color of the first color implementation layer and the color of the second color implementation layer are independent of each other.

9. The colored transparent solar cell of claim 1, further comprising a fourth hole penetrating the light absorbing layer and exposing the first transparent electrode, wherein the second transparent electrode is extended into the fourth hole.

* * * * *